US007223983B2

(12) United States Patent
Kawasaki et al.

(10) Patent No.: US 7,223,983 B2
(45) Date of Patent: May 29, 2007

(54) CHARGED PARTICLE BEAM COLUMN (75) Inventors: Takeshi Kawasaki, Musashino (JP);
Takaho Yoshida, Higashimatsuyama (JP); Tomonori Nakano, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 111 days.

(21) Appl. No.: 11/196,256

(22) Filed: Aug. 4, 2005

(65) Prior Publication Data
US 2006/0033037 A1 Feb. 16, 2006

(30) Foreign Application Priority Data
Aug. 10, 2004 (JP) ............................. 2004-233286

(51) Int. Cl.
*H01J 3/14* (2006.01)
*H01J 37/28* (2006.01)
(52) U.S. Cl. .................. 250/398; 250/310; 250/396 R; 250/396 ML
(58) Field of Classification Search ........ 250/396 ML, 250/311, 396 R
See application file for complete search history.

(56) References Cited

U.S. PATENT DOCUMENTS

| 4,475,044 | A | * | 10/1984 | Kuroda et al. | ....... | 250/396 ML |
| 5,708,274 | A | * | 1/1998 | Langner et al. | ...... | 250/396 ML |
| 5,757,010 | A | * | 5/1998 | Langner | .............. | 250/396 ML |
| 5,793,048 | A | * | 8/1998 | Petric et al. | ......... | 250/396 ML |
| 6,627,890 | B2 | | 9/2003 | Lanio | | |
| 7,015,481 | B2 | * | 3/2006 | Matsuya | ..................... | 250/398 |
| 2005/0285036 | A1 | * | 12/2005 | Sato et al. | .................. | 250/310 |

FOREIGN PATENT DOCUMENTS

| JP | 2000-348658 | 12/2000 |
| JP | 2001-15055 | 1/2001 |
| JP | 2003-168383 | 6/2003 |
| JP | 2004-127930 | 4/2004 |

OTHER PUBLICATIONS

Joachim Zach et al., "Aberration Correction in a Low Voltage SEM by a Multipole Corrector", Nuclear Instruments and Methods in Physics Research A 363 (1995) pp. 316-325.

* cited by examiner

*Primary Examiner*—Nikita Wells
*Assistant Examiner*—Johnnie L Smith, II
(74) *Attorney, Agent, or Firm*—Antonelli, Terry, Stout & Kraus, LLP.

(57) ABSTRACT

The present invention provides a charged particle beam column that does not cause displacement of an image or degradation of a resolution of images when a charged particle beam is tilted at a large angle. In the charged particle beam column including an aberration corrector, a deflector is used to control the direction of incidence of the charged particle beam on a second condenser lens but the object point of a condenser lens is not shifted. Consequently, the converging charged particle beam is tilted at a large angle with respect to the surface of a specimen without the necessity of shifting the object point of an objective lens lying on the optical axis of the charged particle beam column. At this time, the aberration corrector prevents a shift of an image or degradation of a resolution derived from the tilt of the charged particle beam.

11 Claims, 4 Drawing Sheets

OPTICAL AXIS 60
(PERPENDICULAR
TO THE PAGE)

FIG. 4

CHARGED PARTICLE BEAM COLUMN

CLAIM OF PRIORITY

The present invention claims priority from Japanese Application JP 2004-233286 filed on Aug. 10, 2004, the content of which is hereby incorporated by reference to this application.

FIELD OF THE INVENTION

The present invention relates to a charged particle beam technology, or more particularly, to a charged particle beam column adaptable to inspection/analysis equipment or machining equipment that irradiates a converging charged particle beam to the surface of a specimen.

BACKGROUND OF THE INVENTION

When a charged particle beam scanning microscope such as a scanning electron microscope (SEM) is used to measure the fine three-dimensional shape of the surface of a pattern of semiconductors, a charged particle beam must be obliquely routed to a specimen. The specimen is scanned in a plurality of directions with beams whose incidence angles are largely different from one another. Pieces of information on the height and slope of the surface of the specimen are acquired from secondary-electron images.

For the above measurement, a method of mechanically tilting a specimen and a method of holding a specimen horizontally and electromagnetically bending a charged particle beam are currently adopted. In equipment in which a voltage is applied to a specimen in order to induce a decelerating electric field in the space spreading in front of the specimen, and a beam is forcibly converged in order to attain a high resolution ranging from 3 nm to 5 nm, when the specimen is tilted, the decelerating electric field is so deformed that a normal high-resolution image cannot be formed. Since a field of view may be displaced due to the tilt of the specimen and it takes much time to mechanically tilt the specimen, the throughput of measurement is degraded. The method of tilting the charged particle beam is advantageous in terms of quickness and reproducibility. However, when a beam is tilted by an angle that is ten times larger than a normal convergence angle in order to observe a three-dimensional shape, the adverse effect of aberration caused by an objective lens is intensified. This results in a displacement of a field of view, degradation of a resolution derived from blurring of a spot, or a stream of an image. The resolution becomes much lower than the one attained when a beam is routed normally at right angles.

In efforts to minimize the blurring or displacement of a spot attributable to tilt of a beam, a method of introducing a deflection unit into a field induced by an objective lens in order to attain a desired tilt angle so as to cancel magnification chromatic aberration, that is, chromatic aberration causing enlargement has been proposed (refer to, for example, Japanese Patent Application Laid-Open No. 2000-348658).

Moreover, a method for compensating blurring of an image derived from the magnification chromatic aberration in which a Wiener filter installed in front of an objective lens is used to disperse energy according to an angle, by which a beam is tilted, to such an extent that the magnification chromatic aberration of the objective lens can be canceled has been proposed (refer to, for example, Japanese Patent Application Laid-Open No. 2001-15055).

Moreover, a method of canceling aberration, which an objective lens causes when a beam is tilted, by utilizing the off-axis aberration of other lens (refer to, for example, Japanese Patent Application Laid-Open No. 2004-127930) and a method of electromagnetically tilting an objective lens (refer to, for example, Japanese Patent Application Laid-Open No. 2003-168383) have been proposed.

Moreover, from the viewpoint of compensation of aberration, a means for convoluting a quadrupole field or an octupole field to a charged particle beam in the vicinity of an objective lens where the distance of the beam from an optical axis is large and compensation is achieved quite effectively so as to cancel the chromatic aberration or spherical aberration of the objective lens occurring in a direction corresponding to a certain direction of tilt in which the charged particle beam is tilted, and thus preventing degradation of a resolution has been proposed (refer to, for example, U.S. Pat. No. 6,627,890).

SUMMARY OF THE INVENTION

In equipment for measuring a pattern on a semiconductor wafer using an electron beam as a probe, a low-acceleration electron beam generated with a voltage of about 1 kV is converged to form a spot of about 3 nm in diameter on the surface of a specimen, and the surface of the specimen is scanned in order to form a secondary-electron image. In order to acquire information, which is necessary to manage a process, from the three-dimensional shape of the wafer pattern, there is a demand for observation with a beam tilted at a large angle ranging from 10° to 20°. In the observation with a beam tilted at a large angle, the displacement or blurring of the spot of the beam causes degradation of a resolution or displacement of a field of view which cannot be ignored.

Figure 3A:
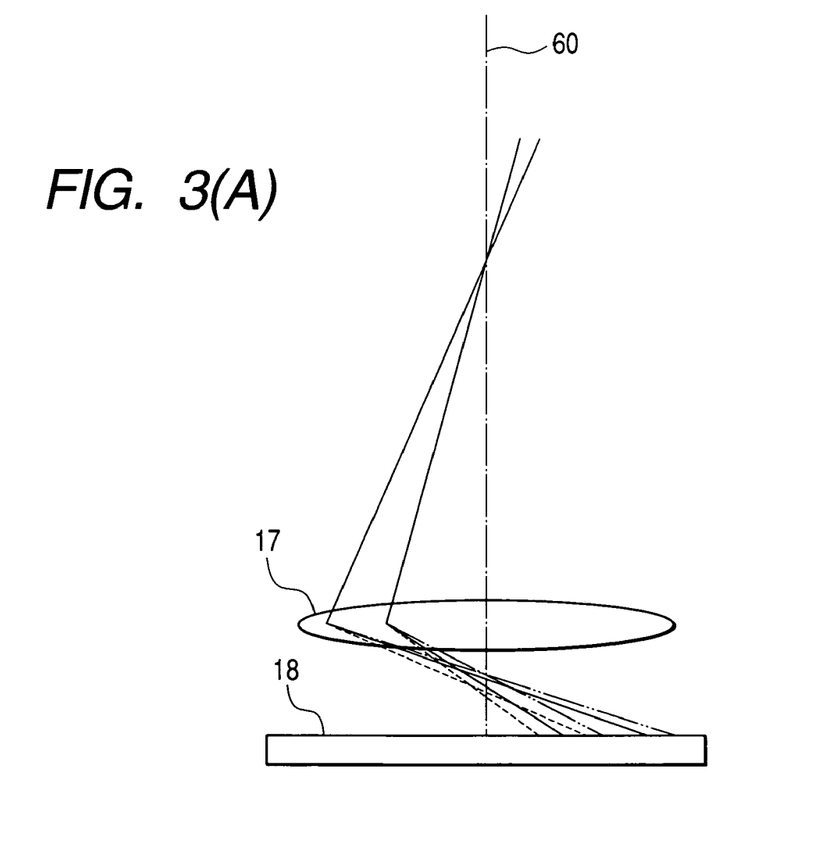
FIGS. 3(A) and 3(B) are explanatory diagrams showing the shape of a spot of a tilted beam on the surface of a specimen.
Figure 3B:
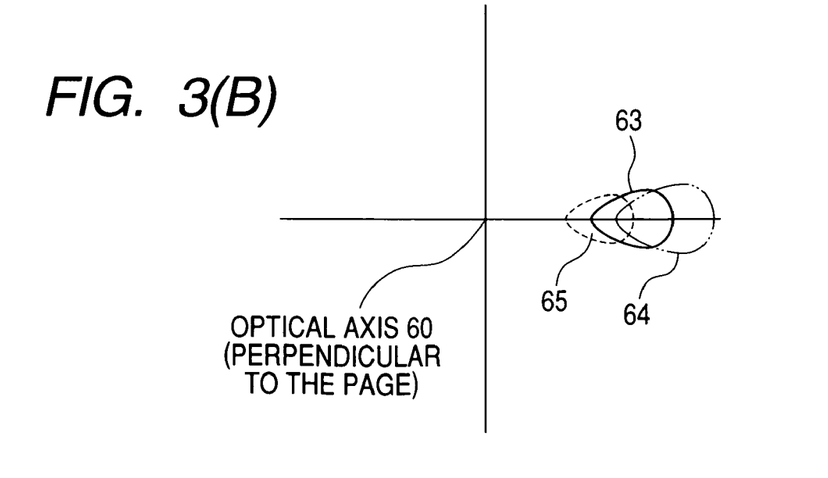

FIG. 3(A) and FIG. 3(B) illustrate the blurring of the spot of a tilted beam. As shown in FIG. 3(A), when a beam is propagated away from an optical axis 60 and passed through an objective lens 17, the beam is tilted with respect to the surface of a specimen 18. The shape of a spot is deformed due to the adverse effect of primary chromatic aberration or tertiary geometric aberrations (spherical aberration, curvature of field, distortional aberration, astigmatism, and comatic aberration) Consequently, as shown in FIG. 3(B), the spot is displaced and stretched sideways due to the variance in energy of incident charged particles. In the drawing, assuming that the optical axis 60 extends perpendicularly to the sheet of paper, reference numeral 63 denotes the spot shape of the beam with standard energy on the specimen plane. Reference numeral 64 denotes the spot shape of the beam with lower energy on the specimen plane. Reference numeral 65 denotes the spot shape of the beam with higher energy on the specimen plane.

In the aforesaid method in accordance with the related art (Japanese Patent Application Laid-Open No. 2000-348658), a deflection unit is introduced into a field induced by an objective lens in order to minimize the blurring or displacement of the spot of a tilted beam. Thus, a desired tilt angle is attained in order to cancel magnification chromatic aberration. However, the space where the deflection unit is located must be reserved in the vicinity of the objective lens or within the field. There is difficulty in incorporating the deflection unit without affecting the field induced by the objective lens of a magnetic field immersion type or a high-resolution type that undergoes a decelerating electric field.

Moreover, according to the method of other related art (Japanese Patent Application Laid-Open No. 2001-15055), a Wiener filter disposed in front of an objective lens is used to disperse energy according to an angle by which a beam is tilted to such an extent that magnification chromatic aberration caused by the objective lens can be canceled. Thus, the blurring of an image derived from the magnification chromatic aberration is compensated. However, since the dispersion of energy caused by the Wiener filter occurs in a certain direction, this method can cope with the blurring occurring in the specific direction in which the beam is tilted. This is intended mainly to minimize the blurring of a spot by compensating magnification chromatic aberration caused by the objective lens and to thus prevent degradation of a resolution. However, when a beam is tilted at a large angle, the displacement of a field of view whose magnitude is as large as a sub micron diameter takes place at the same time because of spherical aberration or comatic aberration caused by the objective lens. Therefore, measures must be taken by electromagnetically shifting the beam.

Moreover, according to the method of other related art (U.S. Pat. No. 6,627,890), from the viewpoint of compensation of aberration, a means for preventing degradation of a resolution is adopted in order to convolute a quadrupole field or an octupole field to a charged particle beam in the vicinity of an objective lens where the charged particle is separated from an optical axis and compensation is achieved quite effectively, and to thus cancel chromatic aberration or spherical aberration caused by the objective lens in a direction corresponding to a certain direction of tilt in which the beam is tilted. However, there is spatial difficulty in incorporating a multipole field generating mechanism without affecting a field induced by an objective lens of a magnetic field immersion type or a high-resolution type that undergoes a decelerating electric field. This poses a problem in that the direction of tilt in which a charged particle beam is tilted is limited according to the direction of the quadrupole field or octupole field.

Accordingly, an object of the present invention is to provide a charged particle beam column that does not cause displacement of an image or degradation of a resolution of images despite a beam is tilted at a large angle.

In order to accomplish the above object, the charged particle beam column in accordance with the present invention is characterized by the points described below.

(1) A charged particle beam column in accordance with the present invention comprises: a charged particle source that supplies a charged particle beam; one or more condenser lenses that control the convergence angle of the charged particle beam radiated from the charged particle source and the convergent position thereof; an objective lens that converges the charged particle beam on the surface of a specimen; an aberration corrector that compensates both or either of chromatic aberration and spherical aberration caused by the condenser lenses and the objective lens; a deflector that controls the direction of incidence of the charged particle beam on the aberration corrector; and a scanning means for scanning the surface of the specimen with the charged particle beam. Herein, the tilted charged particle beam is converged on the surface of the specimen at a predetermined angle without the necessity of shifting the object point of the objective lens.

(2) A charged particle beam column in accordance with the present invention comprises: a charged particle source that supplies a charged particle beam; one or more condenser lenses that control the convergence angle of the charged particle beam radiated from the charged particle source and the convergent position thereof; an objective lens that converges the charged particle beam on the surface of a specimen; an aberration corrector that compensates both or either of chromatic aberration and spherical aberration caused by the condenser lenses and the objective lens; a movable aperture that limits the incident position of the charged particle beam entering the aberration corrector and the quantity of the incident beam; and a scanning means for scanning the surface of the specimen with the charged particle beam. Herein, a control means is included for controlling the movable aperture so as to modify the direction of emission from the object point of the objective lens without shifting the object point of the objective lens lying on the optical axis of the charged particle beam column, and for thus routing the charged particle beam to the objective lens. Consequently, the tilted charged particle beam is converged on the surface of the specimen at a predetermined angle.

(3) In the charged particle beam column mentioned in the above paragraph (2), the movable aperture includes an aperture stop and a two-dimensional position control mechanism that is controlled by the control means. The aperture stop is disposed at a desired position determined with a distance from the optical axis serving as a center axis and an angle of rotation about the optical axis. Consequently, the direction of emission of the charged particle beam from the object point of the objective lens is controlled without the necessity of shifting the object point of the objective lens.

(4) A charged particle beam column in accordance with the present invention comprises: a charged particle source that supplies a charged particle beam; one or more condenser lenses that control the convergence angle of the charged particle beam radiated from the charged particle source and the convergent position thereof; an objective lens that converges the charged particle beam on the surface of a specimen; an aberration corrector that compensates both or either of chromatic aberration and spherical aberration caused by the condenser lenses and the objective lens; a deflector that controls the direction of incidence of the charged particle beam on the aberration corrector; a movable aperture located near and ahead of the deflector; and a scanning means for scanning the surface of the specimen with the charged particle beam. Herein, the charged particle beam is tilted at an angle of 10° or more with respect to the optical axis of the charged particle beam column but the object point of the objective lens lying on the optical axis is not shifted. The aberration corrector compensates aberration derived from the tilt of the charged particle beam.

(5) In the charged particle beam column mentioned in the above paragraph (4), the movable aperture includes an aperture stop and the aperture stop can be aligned with or deviated from the optical axis. The charged particle beam is tilted at the above angle with respect to the optical axis by optimally determining the diameter of the aperture stop and controlling the deflector.

(6) In the charged particle beam column having the foregoing components, the aberration corrector has two or more stages or four or less stages of a combination of a multipole lens of an electric field type or a magnetic field type and a multipole lens of an electromagnetic composite type. The multipole lenses are arranged with optical axis of the charged particle beam column used in common as their axes.

According to the present invention, a charged particle beam column that does not cause displacement of an image or degradation of a resolution of images despite a beam is tilted at a large angle.

DETAILED DESCRIPTION OF THE PREFERRED EMBODIMENTS

Referring to the drawings, embodiments of the present invention will be described below.

A case where electrons are adopted as charged particles will be described as the best mode for implementing the present invention. Even when positrons, ions, or other charged particles are adopted, a lens, an aberration corrector, and other components are in principle used in common, though they are modified according to the adopted kind of charged particles.

(First Embodiment)

Figure 1:
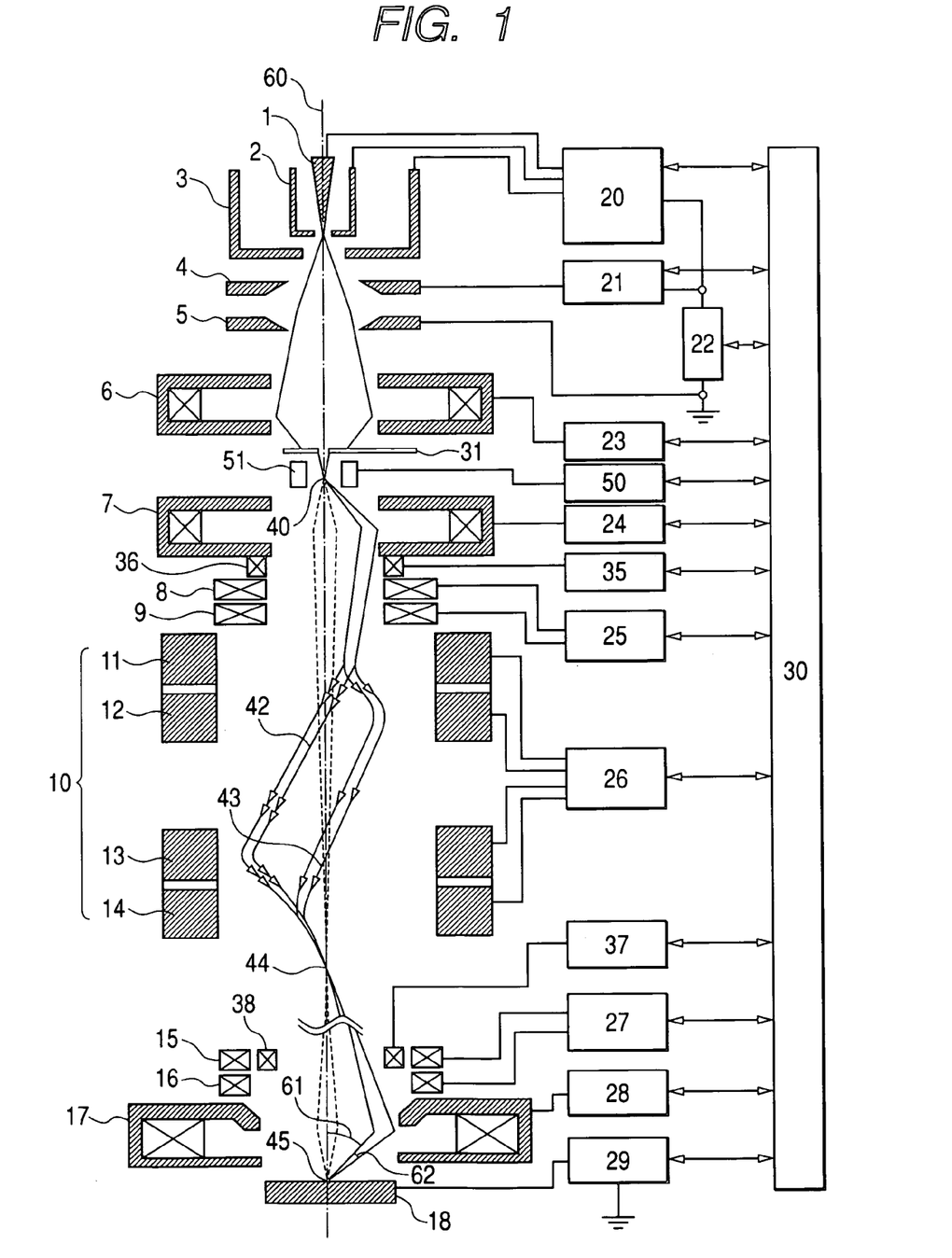
FIG. 1 is an explanatory diagram showing the outline configuration of an electron beam column in accordance with the first embodiment of the present invention, and trajectories of an electron beam.

FIG. 1 shows the outline configuration of an electron beam column in accordance with the first embodiment of the present invention and the trajectories of an electron beam.

A Schottky emitter 1 is an electron source that has oxygen and zirconium diffused into a tungsten single crystal and makes the most of the Schottky effect. A suppressor electrode 2 and an extraction electrode 3 are located near the Schottky emitter 1. The Schottky emitter 1 is heated and a voltage of about +2 kV is applied to the Schottky emitter 1 and the extraction electrode 3, whereby the Schottky emitter 1 radiates electrons due to the Schottky effect. A negative voltage is applied to the suppressor electrode 2 in order to suppress electrons radiated from any place other than the distal end of the Schottky emitter 1. Electrons coming out of the opening of the extraction electrode 3 are accelerated and converged by an electrostatic lens composed of a first anode 4 and a second anode 5. A first condenser lens 6 and a movable aperture 31 limit the diameter of the beam of electrons. The beam then passes through a second condenser lens 7, an upper deflection coil 8, and a lower deflection coil 9, and enters an aberration corrector 10.

A deflector 51 is located at a crossover point 40 (object point of the condenser lens 7) between the first condenser lens 6 and the second condenser lens 7. The deflector 51 controls the direction of a beam incident on the second condenser lens 7 and the tilt thereof. Owing to the deflector 51, deflection is performed in only one stage and the crossover point 40 need not be shifted but the direction of emission from the crossover point can be modified. Preferably, the deflector 51 has the ability to deflect a beam not only in one direction but also in any direction around the optical axis. If a deflector cannot be disposed at the position of the crossover point 40, deflection is performed in two stages in any other place so that a beam will be seen emitted from the crossover point 40 at different angles toward the second condenser lens 7. Thus, the same advantage as the aforesaid one is provided.

The upper deflection coil 8 and lower deflection coil 9 are used to align the axis of the second condenser lens 7 with the axis of the aberration corrector 10. The aberration corrector 10 has a multipole lens 11, a composite multipole lens 12, a composite multipole lens 13, and a multipole lens 14 arranged with an optical axis 60 used in common as their axes. For compensation of chromatic aberration, the multipole lenses 11 and 14 are used to induce a quadrupole electric field or a quadrupole magnetic field on a plane perpendicular to the optical axis. The composite multipole lenses 12 and 13 are used to induce a quadrupole electric field on the plane and to induce a quadrupole magnetic field, which is 45° turned with respect to the optical axis compared with the quadrupole electric field, on the plane perpendicular to the optical axis. These fields are produced using electric (and magnetic) poles such as quadrupoles, octupoles, or duodecimal-poles. For compensation of not only chromatic aberration but also tertiary spherical aberration, the electric poles are used to induce not only the quadrupole field but also an octupole field. The induced fields are convoluted to a charged particle beam. For compensation of quinary spherical aberration, a duodecimal field is needed. In these cases, the multipole lens must have an octupole or a duodecimal-pole. The electron beam having undergone chromatic aberration or spherical aberration, which will be canceled out by chromatic aberration or spherical aberration caused by the objective lens 17, while passing through the aberration corrector 10 is converged on and swept over a specimen 18 by the objective lens 17 after passing through an upper scanning deflector 15 and a lower scanning deflector 16.

When the present embodiment is adopted as a scanning electron microscope or a semiconductor length measuring machine, a mechanism for detecting and imaging secondary electrons and reflected electrons is included but is not shown herein. A rotationally symmetrical lens of a magnetic field type, an electric field type, or an electric/magnetic field composite type is adopted as the objective lens 17. In the case of the scanning electron microscope, an objective aperture is located above the objective lens 17 but is not shown in the drawing. In order to protect a specimen from being broken by an electron beam and minimize aberration, a voltage may be applied to the specimen 18 using a retarding voltage source 29 so that electrons will be decelerated in the space between the specimen 18 and objective lens 17.

The foregoing components of the electron beam column in accordance with the present embodiment are all encapsulated in a vacuum container and electrically connected to current sources and voltage sources (20 to 29) via connectors. In FIG. 1, there are shown a gun control unit 20, a control voltage source 21, an acceleration voltage source 22, a first condenser lens power supply 23, a second condenser lens power supply 4, abeam deflector power supply 25, an aberration corrector power supply 26, a scanning coil current supply 27, an objective lens power supply 28, a retarding voltage source 29, a stigmator current supply 35 for a stigma coil 36, an objective lens aligner control unit 37 for an objective lens aligner 38, and a deflector control unit 50. A way of supporting the components in the vacuum container is not illustrated for brevity's sake. The power supplies, voltage sources, control units, and others are controlled using a control computer 30, whereby an electron beam can be generated and scan or the like can be controlled.

A tilt angle 61 on the surface of a specimen and the direction of tilt are controlled based on a magnitude of deflection of a beam by which the deflector 51 deflects a beam, and a direction of deflection in which the deflector deflects the beam. A beam convergence angle 62 is controlled based on the diameter of the aperture stop included in the movable aperture 31. Assuming that a convergence angle for normal axial observation (a trajectory indicated with a dashed line in the drawing) is 10 mrad, a beam is tilted at a tilt angle of 200 mrad (approx. 11.5□) that is twenty times larger than the convergence angle. In this case, the diameter of the aperture stop included in the movable aperture is made twenty times larger than that for normal axial observation, the aperture stop is aligned with the optical axis 60, and the aberration corrector is regulated. Thereafter, the diameter of the aperture stop is returned to the value for normal observation and the aperture stop is aligned with the optical axis 60. The deflector 51 deflects a beam by an angle corresponding to the tilt angle of 200 mrad on the surface of the specimen.

The significant feature of the electron optical system is that the first condenser lens 6, second condenser lens 7, deflector 51, aberration corrector 10, upper deflection coil 8, and lower deflection coil 9 are adjusted so that an electron beam will enter the object point (crossover point) 44 of the objective lens at an angle, though the object point 44 is not shifted. If this requirement is not met, off-axis aberration caused by the objective lens 17 cannot be compensated by the aberration corrector 10. Consequently, the spot of the tilted beam is blurred. In FIG. 1, the object point 44 of the objective lens lies behind the aberration corrector 10. Alternatively, the object point 44 may lie ahead of the aberration corrector 10. However, in practice, a mechanism for detecting secondary electrons and reflected electrons is disposed in the space between the object point 44 and the objective lens 17. Therefore, there is difficulty in disposing the aberration corrector 10 in the space. According to the present embodiment, the inclusion of the deflector 51 permits quick change of directions of tilt. Several images are formed and sampled by reversing the positive and negative signs of a set value relevant to deflection, and an offset value is calculated based on a difference between the visions of the images. This makes it easy to set the tilt angle of a beam to zero for three-dimensional measurement of the surface of a specimen. Since both the direction of tilt and the tilt angle can be controlled, a beam can be tilted to such an extent that the inmost part of a groove can be seen clearly. Thus, measures can be taken instantaneously according to a specimen. This is advantageous.

A charged particle beam emitted from the object point 44 of the objective lens 17 at an angle with respect to the optical axis is focused obliquely to the specimen 18 due to an operation of convergence given by the objective lens 17. In order to control the tilt angle of a beam with respect to the surface of the specimen, the direction and angle of a beam emitted from the object point 44 of the objective lens should merely be controlled. This is achieved by controlling incidence of a charged particle beam on the second condenser lens 7 located in front of the aberration corrector 10. At this time, unless the aberration corrector 10 is not activated, since the beam is tilted, the blurring and shift of a spot on the surface of the specimen occur due to magnification chromatic aberration and spherical aberration caused by the objective lens. This brings about degradation of a resolution of images. For the trajectory of a beam to be converged at a large angle, that is, the trajectory of a tilted beam (solid line in the drawing) that is turned with the optical axis 60 as an axis, the aberration corrector 10 interposed between the second condenser lens 7 and objective lens 17 is adjusted on condition that spherical aberration and chromatic aberration should be compensated. In the drawing, there are shown two trajectories 42 and 43 that are separated from each other by the quadrupole fields and are orthogonal to each other while intersecting the optical axis.

The aberration corrector that compensates spherical aberration and chromatic aberration may be realized with a known one (refer to, for example, "Nuclear Instruments and Methods in Physics Research" (by J. Zach, et al., A363, 1995, pp. 316–325)). The description of the principles is omitted.

When a beam is tilted at a large angle that is ten times larger than a convergence angle permitting the beam to fall perpendicularly on a specimen, the aberration corrector is adjusted in order to cancel spherical aberration and chromatic aberration to such an extent that a beam falling on the objective lens at the ten-fold angle will not undergo the aberrations very seriously. The magnitude of spherical aberration is proportional to the cube of the convergence angle. Therefore, if the aberration corrector is used with a spherical aberration coefficient of an objective lens decreased to a one-tenth, the aberration corrector must be finely adjusted so that the spherical aberration coefficient will be equal to or smaller than $\frac{1}{10000}$. As for chromatic aberration, since the magnitude of chromatic aberration is proportional to the convergence angle, if the aberration corrector is used with the chromatic aberration coefficient of the objective lens decreased to a one-tenth, the aberration corrector is adjusted so that the chromatic aberration coefficient will be equal to or smaller than $\frac{1}{100}$. This is achieved by highly precisely regulating the voltage sources and current sources, which are needed to excite the quadrupoles and octupoles included in the aberration corrector, so that the voltage sources and current sources will operate on a stable basis. When the angle of a beam incident on the condenser lens and the direction thereof are restricted while the beam is traveling on part of the trajectory of a beam to be converged at a large angle, the trajectory of a tilted beam (solid line in the drawing) is developed. Consequently, the blurring and shift of a spot derived from magnification chromatic aberration and spherical aberration caused by the objective lens are suppressed. A resolution of images is not degraded compared with the one attained during normal observation.

As mentioned above, according to the present embodiment, a deflector is included for controlling the direction of incidence of a charged particle beam on an aberration corrector, and the aberration corrector is included for compensating both or either of chromatic aberration and spherical aberration caused by condenser lenses and an objective lens. Consequently, the charged particle beam can be tilted and converged on the surface of a specimen at a predetermined angle without the necessity of shifting the object point of the objective lens that lies on an optical axis. Moreover, the present embodiment can be adapted to a scanning electron microscope, semiconductor inspection equipment, or focused ion beam equipment.

(Second Embodiment)

Figure 2:
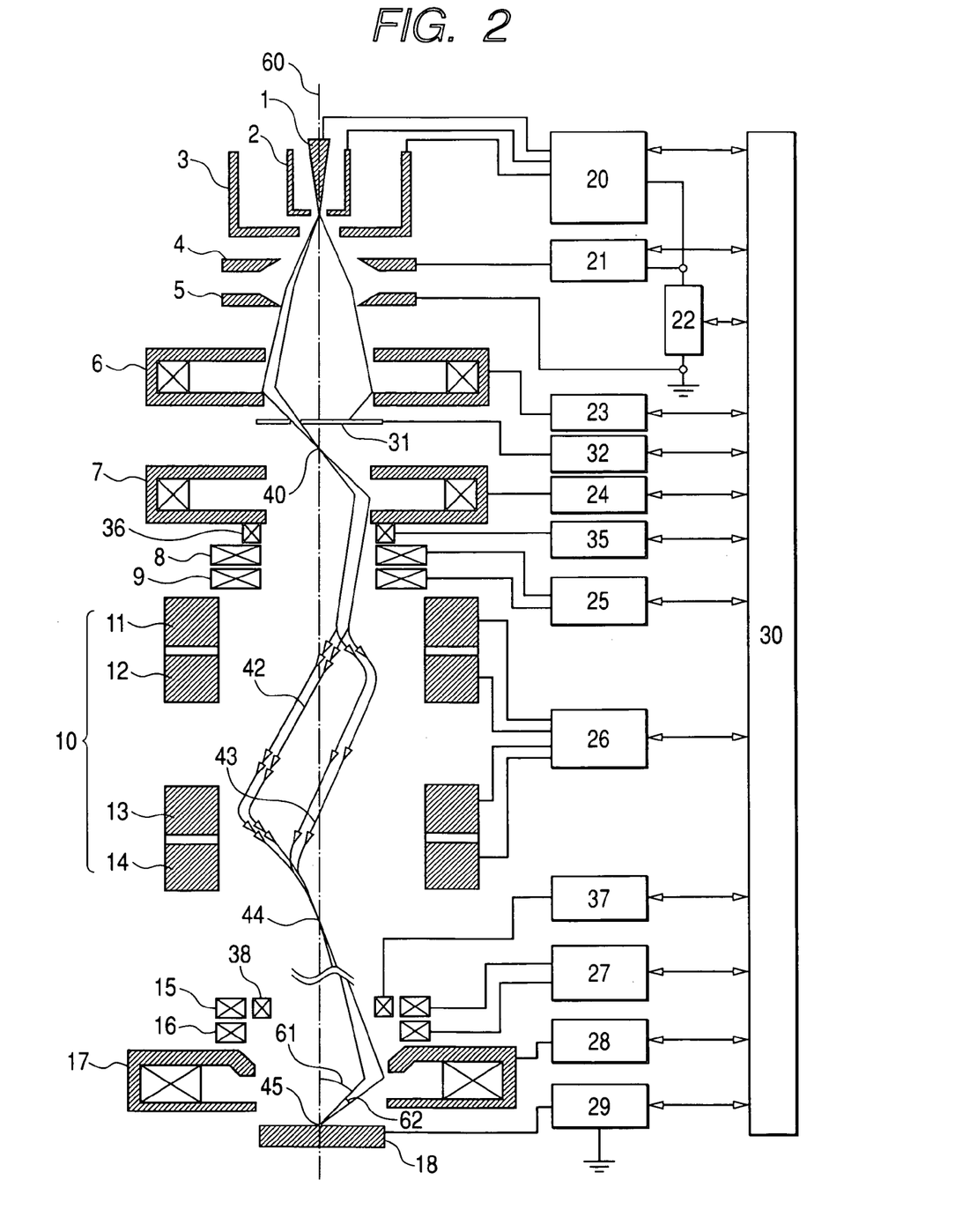
FIG. 2 is an explanatory diagram showing the outline configuration of the second embodiment of the present invention, and trajectories of an electron beam.

FIG. 2 shows the outline configuration of the second embodiment of the present invention and trajectories of an electron beam.

The present embodiment does not include the deflector 51 included in the first embodiment shown in FIG. 1 but includes: a movable aperture 31 that limits the incident position of a charged particle beam entering the aberration corrector 10 and the quantity of the incident beam; and a control means for controlling the movable aperture 31 so as to modify the direction of emission from the object point 44 of the objective lens without shifting the object point 44 of the objective lens that lies on the optical axis, and that thus routes the charged particle beam to the objective lens 17. Thus, the charged particle beam is tilted and converged on the surface of a specimen at a predetermined angle.

In the drawing, a two-dimensional position control mechanism 32 moves the movable aperture 31 to a desired position on a plane perpendicular to an optical axis under the control of the control computer 30. The tilt angle 61 of a tilted beam and the direction of rotation thereof around the optical axis are determined with the distance of the aperture stop included in the movable aperture 31 from the optical axis 60 and the angle of rotation. The convergence angle 62 of the tilted beam is determined with the diameter of the aperture stop.

According to the trajectories of a tilted beam employed in the embodiments shown in FIG. 1 and FIG. 2, the larger the tilt angle 61 is, the greater the adverse effect of quinary aperture aberration is. Duodecimal-poles may be adopted as the multipole lenses constituting the aberration corrector 10 in order to convolute duodecimal-pole fields to a charged particle beam, or, more particularly, the composite multipole lenses 12 and 13 may be used to excite the duodecimal-pole fields. In this case, when the charged particle beam is tilted in both x and y directions (with the optical axis 60 regarded as a z axis), part of the quinary aperture aberration occurring in a direction of tilt can be compensated. Displacement of an image will not take place.

(Third Embodiment)

Figure 4:
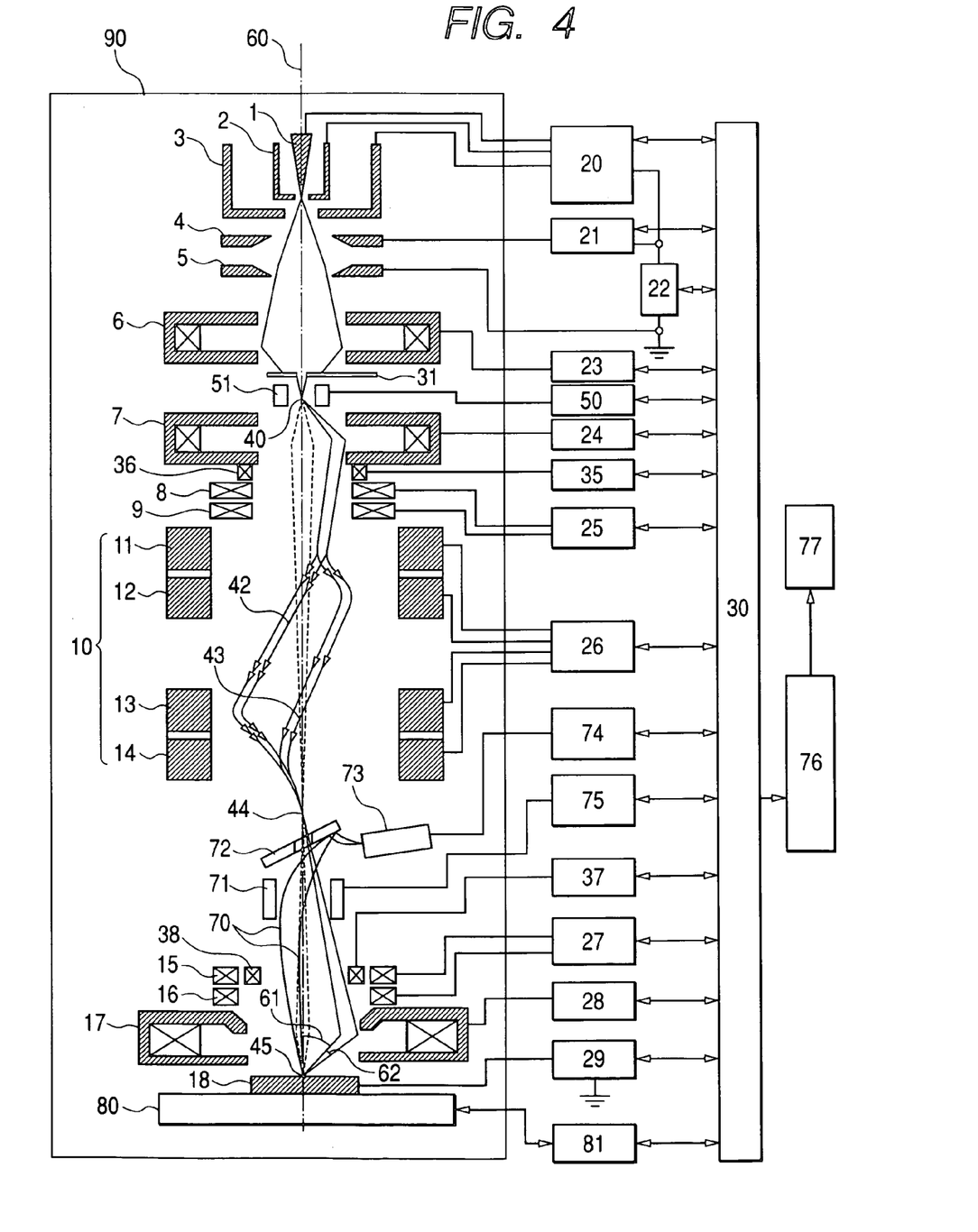
FIG. 4 is an explanatory diagram showing the configuration of the major portion of a CD-SEM having the third embodiment of the present invention included therein.

FIG. 4 shows the configuration of the major portion of a CD-SEM (length measuring scanning electron microscope), to which the present invention is adapted, as the third embodiment of the present invention.

The CD-SEM comprises a chamber 90 the interior of which is deaerated to enter a vacuum, a computer 30, and various control power supplies (20 to 29, 35, 37, 50, 74, 75, and 81) to be controlled by the computer 30, an image processing unit 76, a monitor 77, and an auxiliary chamber (not shown) to be used to carry a specimen to the chamber 90. In addition to the electron beam column including the aberration corrector and being shown in FIG. 1, a mechanism for detecting secondary electrons that are generated when an electron beam is irradiated to a specimen and a specimen stage to be used to carry or move a specimen are incorporated in the chamber 90. A focused spot 45 of an electron beam is swept using the scanning deflectors 15 and 16 in order to scan the specimen 18 (for example, a semiconductor wafer). Secondary electrons 70 generated during the scan are accelerated with a negative voltage applied to the specimen 18 from the voltage source 29. The secondary electrons reach an E×B filter 71 located upward. When a voltage and a magnetic field strength to be applied to the E×B filter 71 are appropriately adjusted, the trajectory of an incident primary beam will not be modified and the secondary electrons 71 are deflected and collided against a reflection plate 72. The collision causes the reflection plate 17 to generate the second secondary electrons. The secondary electrons are efficiently collected by a secondary electron detector 73 located near the reflection plate 17 and converted into an electric signal. When the detection of secondary electrons is synchronized with scan with an electron beam, an image of the surface of a specimen can be formed. The image processing unit 76 processes the image to sample information on a line profile. The image is compared with both an image of a specimen having standard dimensions and the line profile, whereby the length of a pattern on the surface of the specimen can be measured. The image processed by the image processing unit 76 and the result of length measurement can be viewed through a monitor 77.

As described above, according to the present invention, a charged particle beam column for observation using a tilted beam that does not cause displacement of an image or degradation of a resolution of images even when a beam is tilted at a large angle (10° or more) can be realized and may be adapted to a scanning electron microscope, semiconductor inspection equipment, focused ion beam equipment, or the like.

What is claimed is:

1. A charged particle beam column comprising:
   a charged particle source that supplies a charged particle beam;
   one or more condenser lenses that control the convergence angle of the charged particle beam radiated from the charged particle source and the convergent position thereof;
   an objective lens that converges the charged particle beam on the surface of a specimen;
   an aberration corrector that compensates both or either of chromatic aberration and spherical aberration caused by the condenser lenses and the objective lens;
   a deflector that controls the direction of incidence of the charged particle beam on the aberration corrector; and
   a scanning means for scanning the surface of the specimen with the charged particle beam, wherein:
   the tilted charged particle beam is converged on the surface of the specimen at a predetermined angle without the necessity of shifting the object point of the objective lens lying on the optical axis of the charged particle beam column.

2. The charged particle beam column according to claim 1, wherein the aberration corrector comprises two or more or four or less stages of a combination of a multipole lens of an electric field type or a magnetic field type and a multipole lens of an electromagnetic composite type, and the multipole lenses are arranged with the optical axis used in common as their axes.

3. A charged particle beam column comprising:
   a charged particle source that supplies a charged particle beam;
   one or more condenser lenses that control the convergence angle of the charged particle beam radiated from the charged particle source and the convergent position thereof;
   an objective lens that converges the charged particle beam on the surface of a specimen;
   an aberration corrector that compensates both or either of chromatic aberration and spherical aberration caused by the condenser lenses and the objective lens;
   a movable aperture that limits the incident position of the charged particle beam entering the aberration corrector and the quantity of the incident charged particle beam; and
   a scanning means for scanning the surface of the specimen with the charged particle beam, wherein:
   a control means for controlling the movable aperture so as to modify the direction of emission from the object point of the objective lens without shifting the object point of the objective lens lying on the optical axis, and thus routing the charged particle beam to the objective lens is included in order to converge the tilted charged particle beam on the surface of the specimen at a predetermined angle.

4. The charged particle beam column according to claim 3, wherein:
  the movable aperture includes an aperture stop and a two-dimensional position control mechanism that is controlled by the control means;
  the aperture stop is disposed at a desired position determined with a distance from the optical axis serving as a center axis and an angle of rotation about the optical axis in order to control the direction of emission of the charged particle beam from the object point of the objective lens without shifting the object point of the objective lens lying on the optical axis.

5. The charged particle beam column according to claim 3 or 4, wherein the aberration corrector comprises two or more or four or less stages of a combination of a multipole lens of an electric field type or a magnetic field type and a multipole lens of an electromagnetic composite type, and the multipole lenses are arranged with the optical axis used in common as their axes.

6. The charged particle beam column according to claim 2, wherein the aberration corrector includes a plurality of stages of duodecimal-poles, and one stage or a plurality of stages of duodecimal-poles is excited in order to compensate part of quinary aperture aberration occurring in the direction of tilt of the charged particle beam with respect to the optical axis of the charged particle beam column.

7. A charged particle beam column comprising:
  a charged particle source that supplies a charged particle beam;
  one or more condenser lenses that control the convergence angle of the charged particle beam radiated from the charged particle source and the convergent position thereof;
  an objective lens that converges the charged particle beam on the surface of a specimen;
  an aberration corrector that compensates both or either of chromatic aberration and spherical aberration caused by the condenser lenses and the objective lens;
  a deflector that controls the direction of incidence of the charged particle beam on the aberration corrector;
  a movable aperture located near and ahead of the deflector; and
  a scanning means for scanning the surface of the specimen with the charged particle beam, wherein:
  the charged particle beam is tilted at an angle of 10° or more with respect to the optical axis of the charged particle beam column but the object point of the objective lens lying on the optical axis is not shifted; and
  the aberration corrector compensates aberration derived from the tilt of the charged particle beam.

8. The charged particle beam column according to claim 7, wherein the movable aperture includes an aperture stop and the aperture stop can be aligned with or deviated from the optical axis, and the charged particle beam is tilted at the angle of 10° or more with respect to the optical axis by appropriately determining the diameter of the aperture stop and controlling the deflector.

9. The charged particle beam column according to claim 7 or 8, wherein the aberration corrector comprises two or more or four or less stages of a combination of a multipole lens of an electric field type or a magnetic field type and a multipole lens of an electromagnetic composite type, and the multipole lenses are arranged with the optical axis used in common as their axes.

10. The charged particle beam column according to claim 1 or 7, wherein the deflector has an ability to deflect a charged particle beam in any direction around the optical axis.

11. The charged particle beam column according to claim 5, wherein the aberration corrector includes a plurality of stages of duodecimal-poles, and one stage or a plurality of stages of duodecimal-poles is excited in order to compensate part of quinary aperture aberration occurring in the direction of tilt of the charged particle beam with respect to the optical axis of the charged particle beam column.

* * * * *